(12) United States Patent
Hamamoto

(10) Patent No.: US 7,005,643 B2
(45) Date of Patent: Feb. 28, 2006

(54) INFRARED SENSOR

(75) Inventor: Kazuaki Hamamoto, Nagoya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/811,873

(22) Filed: Mar. 30, 2004

(65) Prior Publication Data

US 2004/0188618 A1 Sep. 30, 2004

(30) Foreign Application Priority Data

Mar. 31, 2003 (JP) .............................. 2003-096380

(51) Int. Cl.
*G01J 5/02* (2006.01)
(52) U.S. Cl. .................................. 250/338.1
(58) Field of Classification Search .............. 250/338.1
See application file for complete search history.

(56) References Cited

U.S. PATENT DOCUMENTS 3,596,096 A * 7/1971 Koehler ................. 250/339.03
5,056,929 A * 10/1991 Watanabe et al. ........... 374/181
5,099,120 A * 3/1992 Turnbull ................... 250/338.2

FOREIGN PATENT DOCUMENTS

| JP | 03196583 | * | 8/1991 |
| JP | A-H06-194229 | | 7/1994 |
| JP | A-H07-58134 | | 3/1995 |
| JP | 0888411 | * | 4/1996 |
| JP | A-H08-122161 | | 5/1996 |

* cited by examiner

*Primary Examiner*—David Porta
*Assistant Examiner*—Marcus Taningco
(74) *Attorney, Agent, or Firm*—Posz Law Group, PLC

(57) ABSTRACT

An infrared sensor formed as a membrane on a substrate and detecting infrared rays by an infrared detector on that membrane, wherein even if an adhesive used for mounting the infrared sensor on a mounting surface creeps up to the membrane, it is made possible to prevent a drop in the sensor sensitivity by mounting the infrared sensor on a mounting surface by an adhesive having a heat conductivity of not more than seven times the heat conductivity of a fluid present in the inner cavity below the membrane.

10 Claims, 7 Drawing Sheets

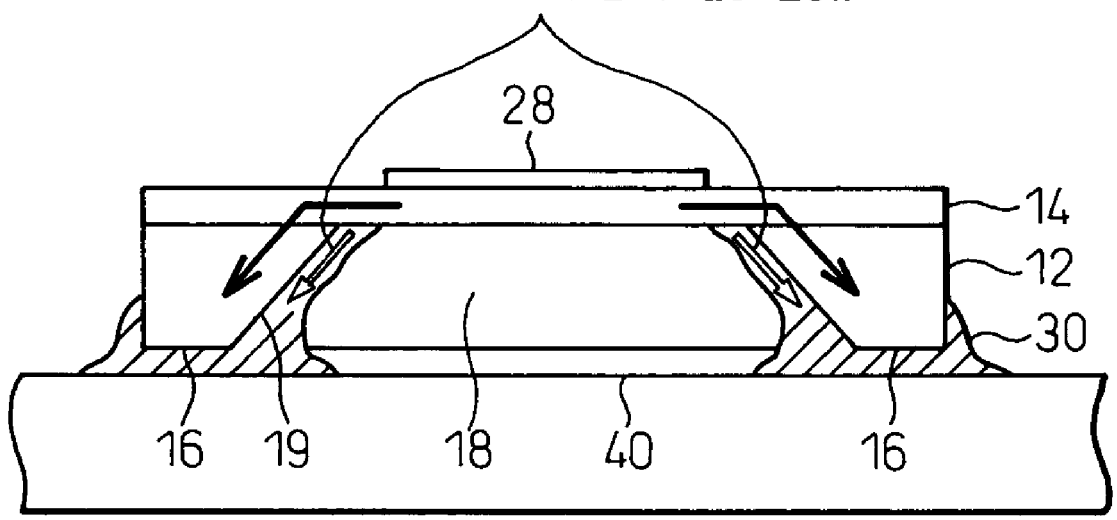

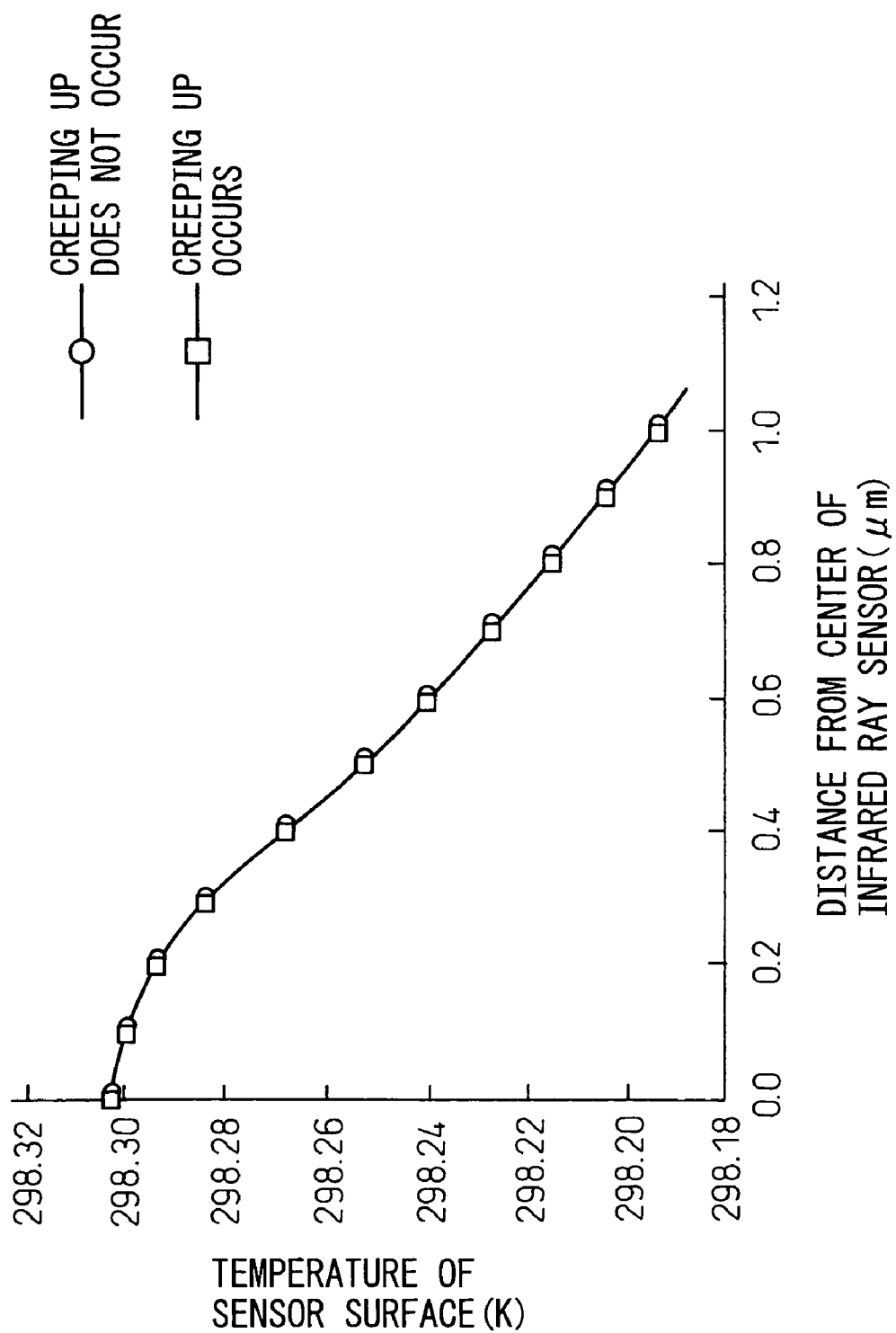

INFRARED SENSOR

BACKGROUND OF THE INVENTION

1. Field of the Invention

The present invention relates to an infrared sensor structured as a membrane and provided with an infrared detector generating an electric signal based on changes in temperature occurring at the time of receiving infrared rays, more particularly relates to an infrared sensor mounted by bonding with a mounting surface constituted by a sensor support using an adhesive.

2. Description of the Related Art

As will be explained in detail later with reference to the drawings, when mounting an infrared sensor on a sensor support using an adhesive, the excess adhesive squeezed out from the bottom of the substrate of the infrared sensor creeps up along the inside walls of the inner cavity of the substrate below the membrane. If reaching the membrane, the temperature difference between the hot contacts and cold contacts of the thermocouples will become small and a drop in sensor sensitivity will be caused.

In the semiconductor sensor disclosed in Japanese Unexamined Patent Publication (Kokai) No. 7-58134 as related art, to prevent this creep of the adhesive, as shown in the later drawings, an adhesive constituted by a die bonding paste is provided locally rather than over the entire bottom surface of the substrate. With this mounting method, however, it is necessary to control the coating positions and amounts of coating of the adhesive in the mounting step of the infrared sensor. This is troublesome.

SUMMARY OF THE INVENTION

An object of the present invention is to provide an infrared sensor formed as a membrane on a substrate and detecting infrared rays by an infrared detector on that membrane, wherein even if an adhesive used for mounting the infrared sensor on a mounting surface creeps up to the membrane, it is possible to prevent a drop in the sensor sensitivity.

To attain the above object, there is provided an infrared sensor mounted on a mounting surface by an adhesive having a heat conductivity of not more than seven times the heat conductivity of a fluid present in an inner cavity below the membrane.

BRIEF DESCRIPTION OF THE DRAWINGS

These and other objects and features of the present invention will become clearer from the following description of the preferred embodiments given with reference to the attached drawings, wherein:

FIG. 1(a) is a perspective view of an infrared sensor according to a first embodiment of the present invention having a membrane structure, while

FIG. 2 is a view of the state of the adhesive creeping up and reaching the membrane at the time of mounting;

FIG. 4 is a view of the temperature distribution of the sensor surface in the infrared sensor 10 according to the second embodiment of the present invention;

DESCRIPTION OF THE PREFERRED EMBODIMENTS

Before describing the embodiments of the present invention, the related art and the disadvantages therein will be described with reference to the related figures.

Figure 5A:
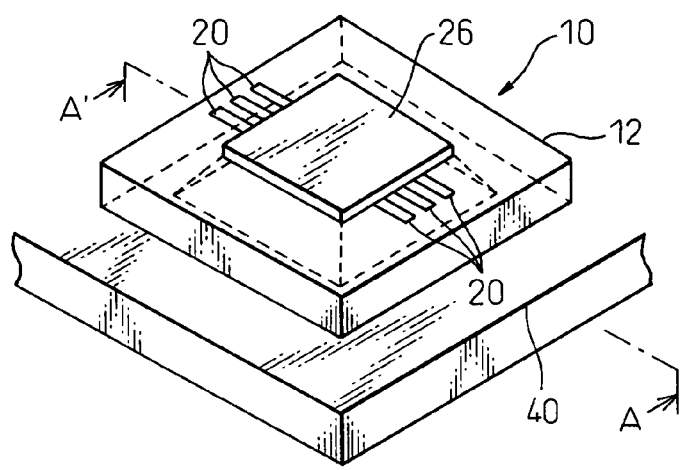
FIG. 5(a) is a perspective view of an infrared sensor according to the related art having a membrane structure.
Figure 5B:
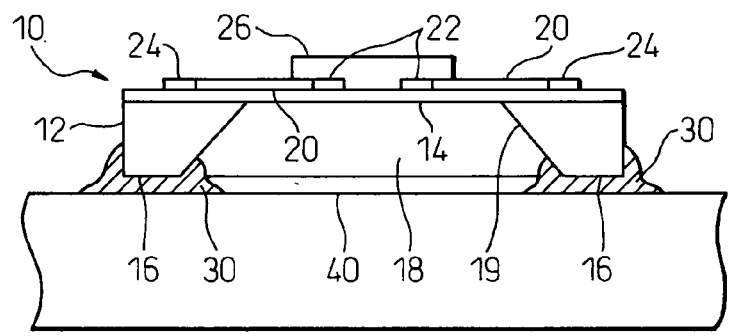
FIG. 5(b) is a cross-sectional view along the line A'–A of the infrared sensor shown in FIG. 5(a)

In general, as an infrared sensor having a membrane structure, a thermopile type infrared sensor is well known. FIG. 5(a) is a perspective view of an infrared sensor of the related art having a membrane structure, while FIG. 5(b) is a cross-sectional view along the line A'–A of the infrared sensor shown in FIG. 5(a).

The infrared sensor 10 of the related art is obtained by etching the back surface of a silicon chip substrate 12 and forming a membrane 14 at the thin part of the substrate. The substrate 12 having the membrane 14 is provided on its top surface with plurality of thermocouples 20 having hot contact parts 22 on the membrane 14 and cold contact parts 25 on the thick part outside of the membrane 14. The hot contact parts of the thermocouples 20 are covered by an infrared ray absorption film 26. The infrared ray absorption film 26 is comprised of a polyester resin containing carbon and is cured by heat. This absorbs infrared rays and enables the temperature of the hot contact parts to be efficiently raised. The substrate 12 is bonded to the mounting surface constituted by the sensor support 40 by an adhesive 30 for mounting.

Figure 5C:
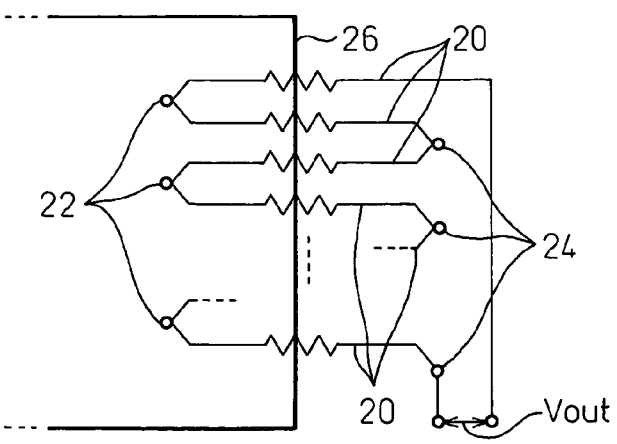
FIG. 5(c) is a view of thermocouples provided on the substrate.

FIG. 5(c) shows thermocouples 20 provided on the top surface of the substrate 12. When infrared rays from the human body etc. strike the substrate, the infrared ray absorption film 26 absorbs the infrared rays and rises in temperature. As a result, the hot contact parts 22 provided on the membrane 14 rise in temperature since the path for conduction of the heat conducted from the infrared ray absorption film 26 is small, while the cold contact parts 24 provided on the thick part at the outside of the membrane do not rise in temperature as the substrate 12 serves as a heat sink. As a result, a temperature difference is caused between the hot contact parts 22 and the cold contact parts 24 and an electromotive force is generated by the Seebeck effect. A plurality of the thermocouples 20 are arranged in series as shown in the figure. The sum Vout of the electromotive forces of the thermocouples becomes the output of the sensor.

The adhesive 30 used in the infrared sensor 10 of the related art was a silver paste having a heat conductivity of about 5 W/mK. This was because an adhesive with a high heat conductivity was preferred so as to facilitate the escape of heat of the thick part of the substrate to the sensor support 40, so that increase the temperature difference between the hot contact parts 22 and cold contact parts 24 is increased and the sensitivity of the infrared sensor 10 is improved. Note that, as an infrared sensor having such a membrane structure, there is the semiconductor chip disclosed in Japanese Unexamined Patent Publication (Kokai) No. 7-58134 (paragraphs [0016] to [0020]).

Figure 6A:
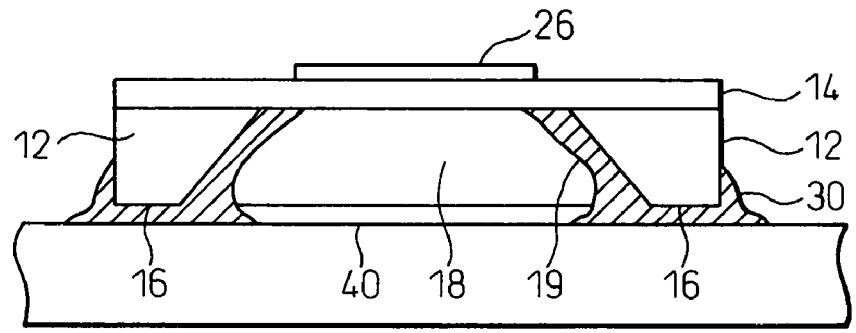
FIGS. 6(a) to 6(c) are views of the states of an adhesive creeping up along the inside walls of an inner cavity of a substrate under a membrane.

As explained above, when using an adhesive for mounting the infrared sensor 10 on the sensor support 40, the excess adhesive 30 squeezed out from the bottom surface 16 of the substrate 12 at the time of mounting creeps up along the inside walls 19 of the inner cavity 18 of the substrate 12 under the membrane 14 and is liable to reach the back surface of the membrane 14. FIG. 6(a) shows the state of the adhesive 30 reaching the back surface of the membrane 14.

Figure 6B:
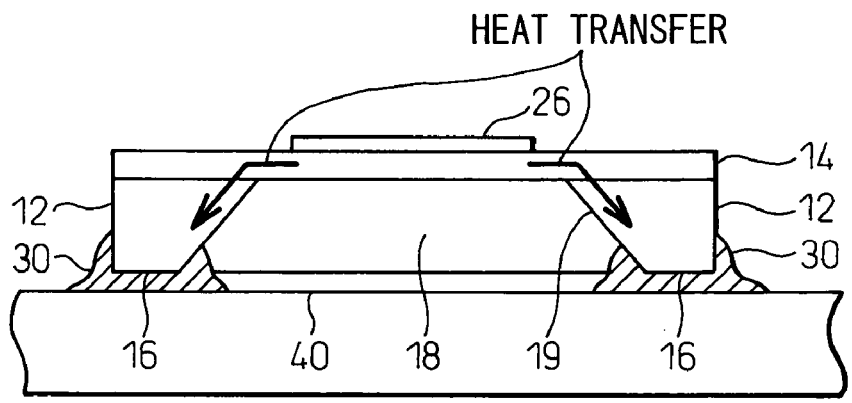

The inner cavity 18 below the membrane 14 contains a low heat conductivity gas with a low heat conductivity of not more than 0.025 W/mK. Due to this, the heat capacity of the hot contact parts 22 is reduced. Accordingly, as shown in FIG. 6(b), it is possible to prevent a drop in the temperature of the membrane 14 and hold the temperature of the hot contact parts 22 as they are when the adhesive does not creep up along the inside walls 19.

Figure 6C:
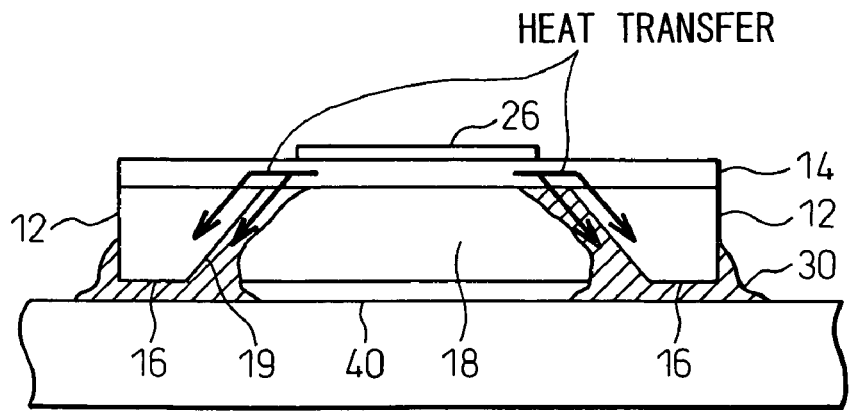

However, when the adhesive 30 creeps up along the inside walls 19 and reaches the membrane 14 as shown in FIG. 6(c), the heat capacity of the hot contact parts 22 ends up becoming larger due to the formation of a heat transfer path by the adhesive 30 with the heat conductivity higher than the fluid in the inner cavity 18. As a result, the temperature difference between the hot contacts and the cold contacts becomes smaller and a drop in the sensor sensitivity is caused.

Figure 7:
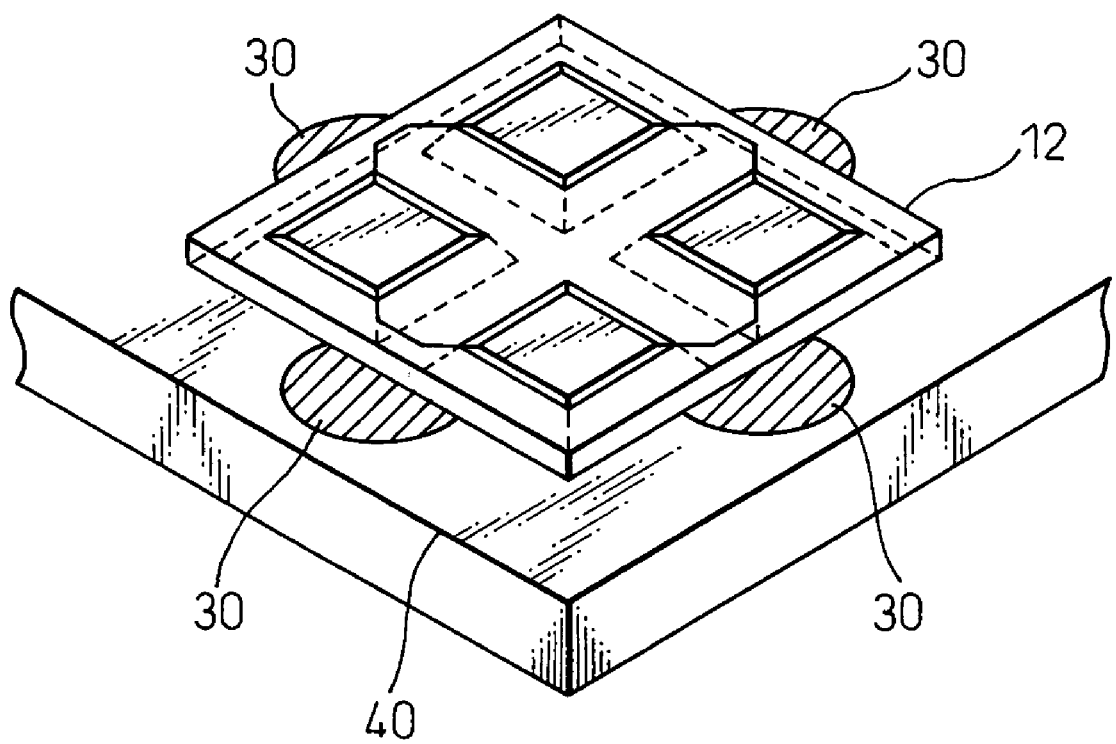
FIG. 7 is a view of an example of a semiconductor sensor of the related art.

In the semiconductor sensor disclosed in Japanese Unexamined Patent Publication (Kokai) No. 7-58134, as explained above, as shown in FIG. 7, an adhesive 30 constituted by a die bonding paste was provided locally rather than over the entire bottom surface of the substrate 12 so as to prevent the above creeping up of the adhesive 30. According to this method, however, to prevent the adhesive 30 from creeping up, it was necessary to control the coating positions and amounts of coating of the adhesive 30 in the mounting step of the infrared sensor 10. This was troublesome as mentioned before.

In view of this problem, the present invention provides an infrared sensor wherein even if an adhesive used for mounting the infrared sensor on a mounting creeps up to the membrane, it is possible to prevent a drop in the sensor sensitivity.

For this purpose, the infrared sensor according to the present invention is mounted on a mounting surface by an adhesive having a heat conductivity of not more than seven times the heat conductivity of a fluid present in the inner cavity surrounded by the bottom surface of the substrate below the membrane and the mounting surface.

By mounting with a low heat conductivity adhesive in this way, even if creep of the adhesive occurs at the time of mounting and the adhesive reaches the membrane, the conduction of heat due to the heat transfer path formed by the creeping adhesive can be suppressed and the heat capacity of the infrared detector can be kept small. Due to this, it becomes possible to prevent a drop in sensor sensitivity of the infrared sensor.

Figure 1A:
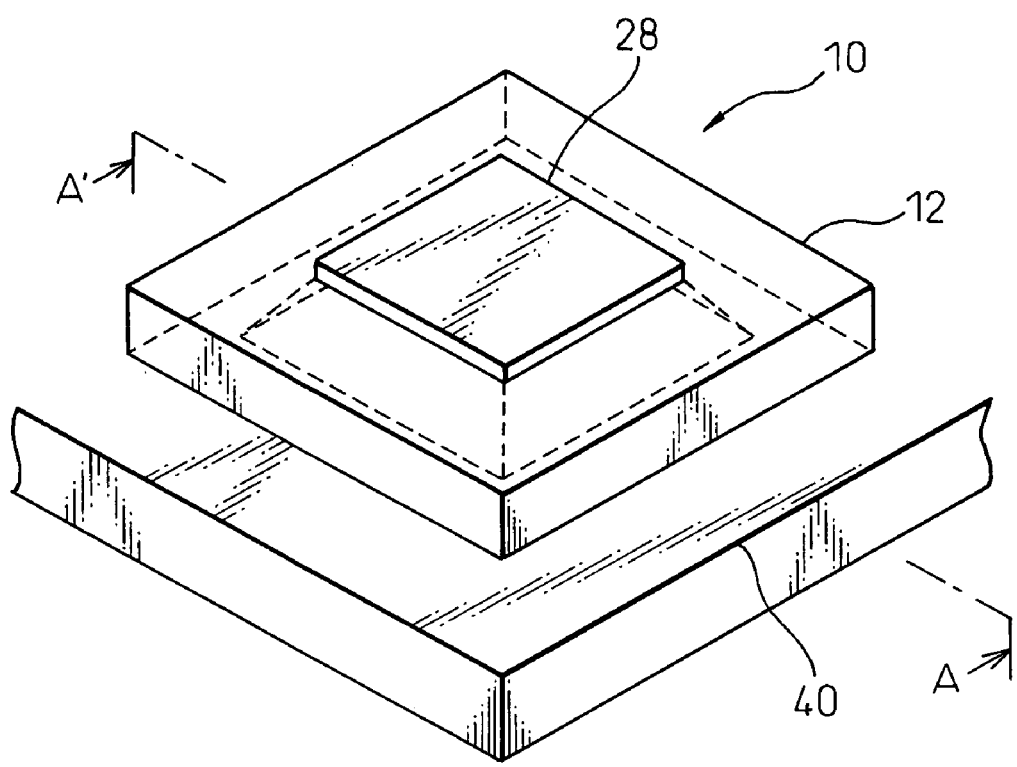
Figure 1B:
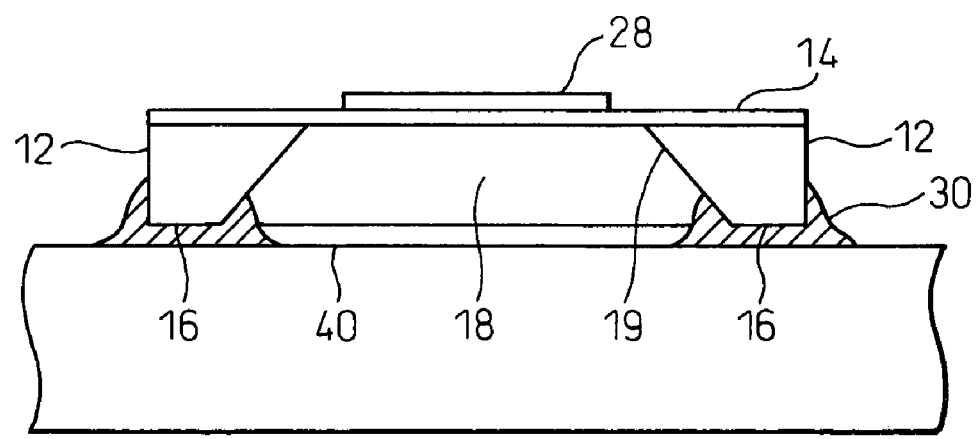
FIG. 1(b) is a cross-sectional view along the line A'–A of the infrared sensor shown in FIG. 1(a)

Next, an infrared sensor according to a first embodiment of the present invention will be explained with reference to the attached drawings. FIG. 1(a) is a perspective view of an infrared sensor according to a first embodiment of the present invention having a membrane structure, while FIG. 1(b) is a cross-sectional view along the line A'–A shown in FIG. 1(a).

The infrared sensor 10 according to the present invention is obtained by etching the back surface of a silicon chip substrate 12 and forming a membrane 14. The top surface of the substrate 12 having the membrane 14 is provided with an infrared detector 28. Here, the infrared sensor 10 is bonded at its bottom surface 16 with a sensor support 40 by an adhesive 30 for mounting.

The inner cavity 18 below the membrane 14 contains a low heat conductivity gas having a heat conductivity of 0 W/mK to 0.025 W/mK and reduces the heat capacity of the infrared detector 28. Therefore, as shown in FIG. 1(b), when the adhesive does not creep up along the inside walls 19, it is possible to prevent a drop in temperature of the membrane 14 and maintain the temperature of the infrared detector 28 as it is.

The infrared sensor 10 according to the present invention uses an adhesive with a low heat conductivity instead of the adhesive with a high heat conductivity such as the silver paste used in the related art (heat conductivity of 5 W/mK) as the adhesive used for mounting to the sensor support 40. As the adhesive with a low heat conductivity and able to be used for bonding a sensor such as the infrared sensor 10 of the present invention, a silicone-based adhesive having a heat conductivity of 0.16 W/mK or so can be suitably used.

FIG. 2 is a view of the state where the adhesive has creeped up along the inner walls 19 of the substrate 12 and reached the membrane 14. Even if the adhesive 30 creeps up and reaches the membrane 14 as shown in FIG. 2, since the heat conductivity of the adhesive 30 used for the infrared sensor 10 according to the present invention is low as explained above, the heat transfer path by the adhesive 30 reaching the membrane 14 is small and therefore the heat capacity of the infrared detector 28 can be kept small.

In this way, by using an adhesive with a low heat conductivity as the adhesive 30 used for mounting to the sensor support 40, even if the adhesive 30 squeezed out from the bottom surface 16 of the substrate 12 at the time of mounting creeps up along the inner walls 19 of the substrate 12 and reaches the membrane 14, the heat capacity of the infrared detector 28 can be kept small and therefore the drop in sensor sensitivity can be prevented.

Figure 3A:
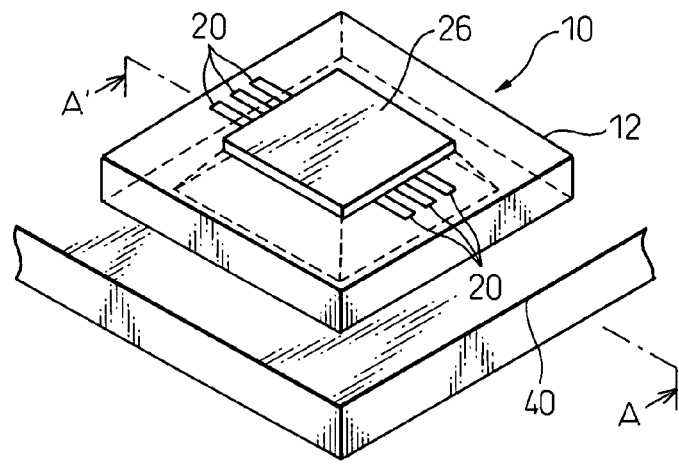
FIG. 3(a) is a perspective view of an infrared sensor according to a second embodiment of the present invention having a membrane structure.
Figure 3B:
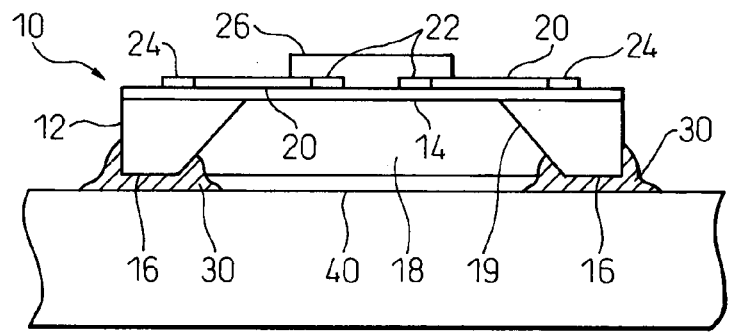
FIG. 3(b) is a cross-sectional view along the line A'–A of the infrared sensor shown in FIG. 3(a)

FIG. 3(a) is a perspective view of an infrared sensor according to a second embodiment of the present invention having a membrane structure, while FIG. 3(b) is a cross-sectional view along the line A'–A of FIG. 3(a).

The infrared sensor 10 according to the second embodiment is provided with a plurality of thermocouples 20 having hot contact parts 22 on the membrane 14 and cold contact parts 24 on the thick part at the outside of the membrane 14. The hot contact parts of the thermocouples 20 are covered by the infrared ray absorption film 26.

Figure 3C:
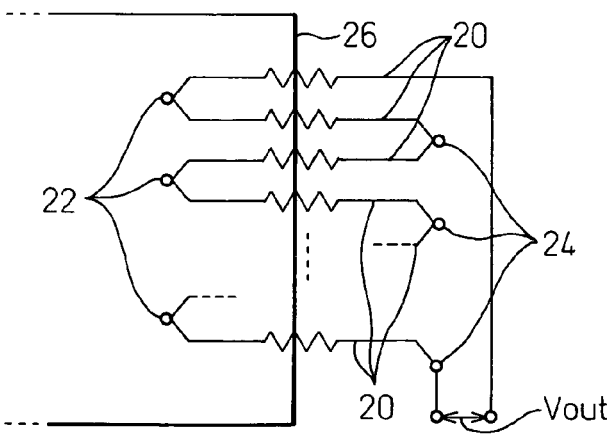
FIG. 3(c) is a view of thermocouples provided on the substrate.

FIG. 3(c) shows the thermocouples 20 provided on the top surface of the substrate 12. When infrared rays strike the substrate, the infrared ray absorption film 26 absorbs the infrared rays and rises in temperature. As a result, the hot contact parts 22 provided on the membrane 14 rise in temperature since the path for conduction of the heat conducted from the infrared ray absorption film 26 is small, while the cold contact parts 24 provided on the thick part at the outside of the membrane do not rise in temperature as the substrate 12 serves as a heat sink. As a result, a temperature difference is caused between the hot contact parts 22 and the cold contact parts 24, and a sensor output Vout corresponding to this temperature difference is output.

When using a low heat conductivity adhesive 30 for mounting the infrared sensor to the sensor support 40, there is the problem that the heat of the thick part of the substrate 12 forming the heat sink of the cold contact parts 24 becomes difficult to relieve to the sensor support 40. However, the function as a heat sink for the cold contact parts 24 can be performed by just the substrate 12, so even if using a low heat conductivity adhesive 30, there is not an effect enough to cause problems in the sensor characteristics.

FIG. 4 shows the temperature distribution of the sensor surface in the infrared sensor 10 according to a second embodiment of the present invention. The illustrated graph shows the results of analysis of the temperature distribution of the surface of the infrared sensor 10 in the case of making the heat conductivity of the fluid present in the hollow part 18 not more than 0.025 W/mK, making the heat conductivity of the adhesive 30 not more than 0.18 W/mK or not more than about seven times the heat conductivity of the low heat conductivity gas, and in the presence and absence of creep of the adhesive 30.

AS shown in FIG. 4, it is learned that regardless of creep of the adhesive, the temperature distribution of the surface becomes substantially the same. Due to this, it is learned that if making the heat conductivity of the adhesive 30 not more than 0.18 W/mK or not more than about seven times the heat conductivity of the low heat conductivity gas present in the cavity 18 of the sensor 10, it is possible to suppress any effects of the creep of adhesive 30 on the sensor sensitivity of the infrared sensor 10.

While the invention has been described with reference to specific embodiments chosen for purpose of illustration, it should be apparent that numerous modifications could be made thereto by those skilled in the art without departing from the basic concept and scope of the invention.

What is claimed is:

1. An infrared senor provided with a substrate having a thick part and a thin part, a membrane constituting the thin part of said substrate, and an infrared detector provided on a top surface of said substrate having said membrane, wherein:

a bottom surface of the thick part of said substrate and a mounting surface for mounting said infrared sensor are bonded by an adhesive for mounting, and said adhesive consists of a material having a heat conductivity not exceeding seven times the heat conductivity of a fluid present in an inner cavity surrounded by the bottom surface of said substrate and said mounting surface.

2. An infrared sensor as set forth in claim 1, wherein said bottom surface of said substrate and said mounting surface are bonded by an adhesive having a heat conductivity of not more than 0.18 W/mK for mounting.

3. An infrared sensor as set forth in claim 1, wherein said adhesive is a silicone-based adhesive.

4. An infrared sensor as set forth in claim 2, wherein said adhesive is a silicone-based adhesive.

5. An infrared sensor as act forth in claim 1, wherein said infrared detector is provided with:

a thermocouple providing a hot contact part on said membrane and providing a cold contact part outside of said membrane on said substrate and an infrared ray absorption film formed on said membrane so as to cover said hot contact part.

6. An infrared sensor as set forth in claim 2, wherein said infrared detector is provided with:

a thermocouple providing a hot contact part on said membrane and providing a cold contact part outside of said membrane on said substrate and an infrared ray absorption film formed on said membrane so as to cover said hot contact part.

7. An infrared sensor as set forth in claim 1, wherein said fluid is a low conductivity gas.

8. An infrared sensor as set forth in claim 2, wherein said fluid is a low conductivity gas.

9. An infrared sensor as set forth in claim 1, wherein a heat conductivity of said fluid is not more than 0.025 W/mK.

10. An infrared sensor as set forth in claim 2, wherein a heat conductivity of said fluid is not more than 0.025 W/mK.

* * * * *